(12) United States Patent
Williams

(10) Patent No.: US 7,040,523 B2
(45) Date of Patent: May 9, 2006

(54) METHOD AND APPARATUS FOR APPLYING VISCOUS OR PASTE MATERIAL ONTO A SUBSTRATE

(75) Inventor: David Godfrey Williams, Merseyside (GB)

(73) Assignee: Dek International GmbH, Zurich (CH)

( * ) Notice: Subject to any disclaimer, the term of this patent is extended or adjusted under 35 U.S.C. 154(b) by 83 days.

(21) Appl. No.: 10/240,696

(22) PCT Filed: Mar. 30, 2001

(86) PCT No.: PCT/GB01/01420

§ 371 (c)(1),
(2), (4) Date: May 1, 2003

(87) PCT Pub. No.: WO01/76333

PCT Pub. Date: Oct. 11, 2001

(65) Prior Publication Data

US 2003/0168006 A1 Sep. 11, 2003

(30) Foreign Application Priority Data

Apr. 4, 2000 (GB) .................................. 0008207
Aug. 14, 2000 (GB) .................................. 0019781

(51) Int. Cl.
*B23K 20/00* (2006.01)
(52) U.S. Cl. ..................................................... 228/33
(58) Field of Classification Search .................. 228/33, 228/25, 27, 253; 118/300, 410; 101/123, 101/120, 124
See application file for complete search history.

(56) References Cited

U.S. PATENT DOCUMENTS

| 4,043,683 | A | * | 8/1977 | Costa et al. ................. 401/264 |
| 5,947,022 | A | * | 9/1999 | Freeman et al. ............ 101/123 |
| 6,276,599 | B1 | * | 8/2001 | Ogawa ........................ 228/254 |
| 6,286,422 | B1 | * | 9/2001 | Lin et al. .................... 101/123 |

FOREIGN PATENT DOCUMENTS

| EP | 0 937 577 | 8/1999 |
| FR | 2 754 473 | 4/1998 |
| GB | 2 341 347 | 3/2000 |
| TW | 398115 | 7/2000 |

* cited by examiner

*Primary Examiner*—Jonathan Johnson
(74) *Attorney, Agent, or Firm*—Renner, Otto, Boisselle & Sklar, LLP

(57) ABSTRACT

An applicator device for abutment by or attachment to a reciprocating mechanism of a viscous fluid material printing machine, the applicator device including: a body having a through passage with an upper, fluid inlet extending along the body and a lower, fluid outlet extending along the body; an elongate, horizontally-extending reservoir for fluid material formed with or detachably mounted on an upper side of the body and being in fluid communication with the inlet of the body; and a displaceable piston extending in the reservoir for displacing fluid material out of the reservoir into the inlet of the body and to the outlet of the body, with the piston being actuable from above by the reciprocating mechanism of the printing machine so as to be displaceable thereby and the applicator device being without and not requiring any other separate motive power source or pipe ducting means for such displacement.

24 Claims, 13 Drawing Sheets

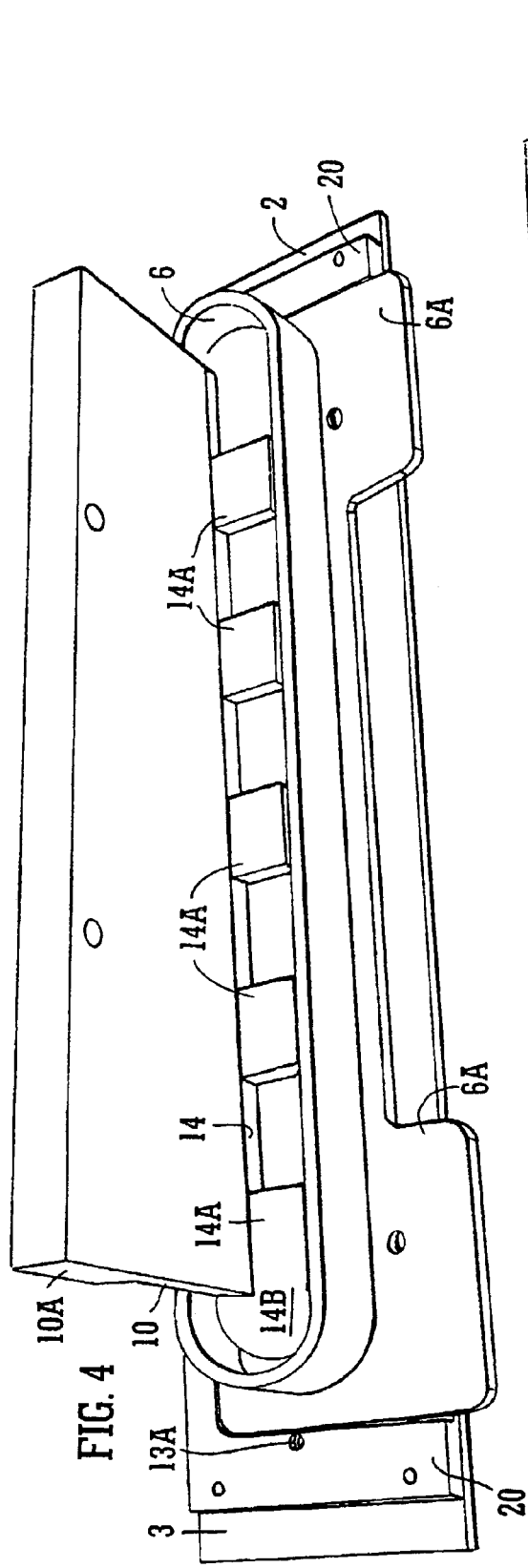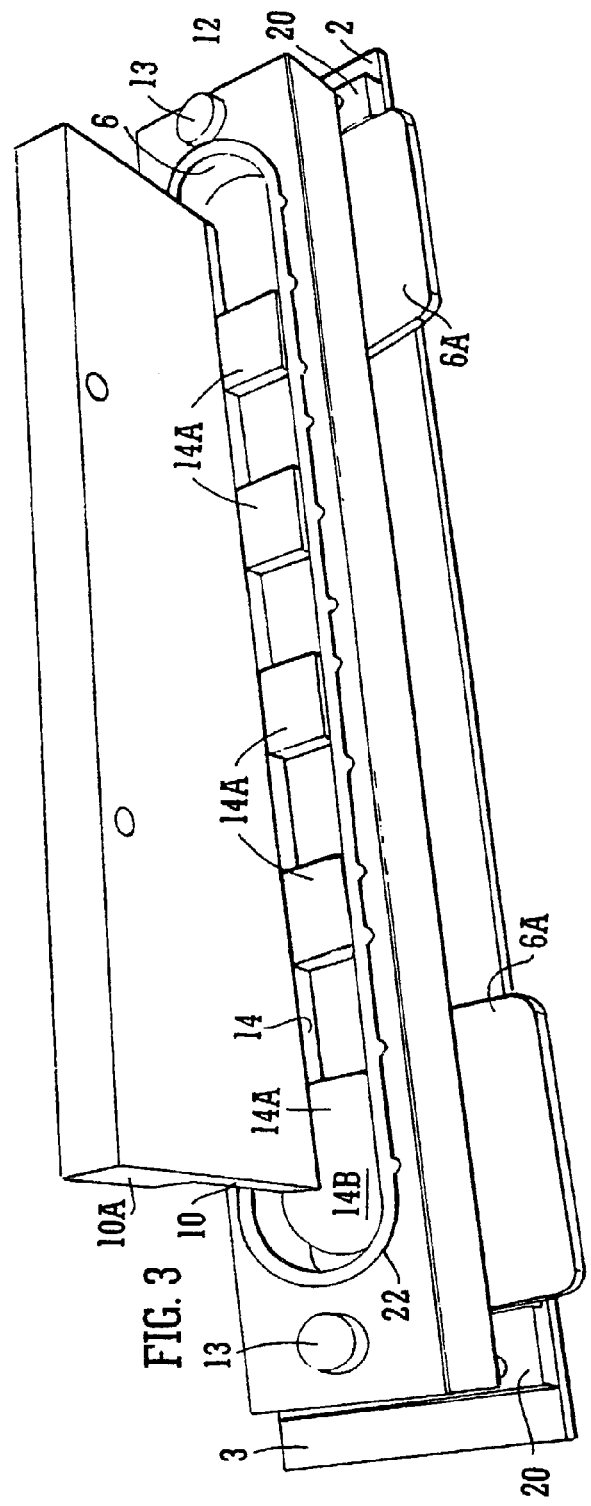

METHOD AND APPARATUS FOR APPLYING VISCOUS OR PASTE MATERIAL ONTO A SUBSTRATE

This application is a national phase of International Application No. PCT/GB01/01420 filed Mar. 30, 2001 and published in the English language.

The present invention relates to an apparatus for applying a viscous or paste-like material through apertures in a stencil onto a substrate beneath the stencil and is particularly suitable for applying solder paste onto a board for producing a printed circuit board or for applying an adhesive or other bonding agent to a substrate via a stencil. The present invention also relates to an adaptor device for a solder paste applicator device with a reservoir for the solder paste and is particularly intended to be used with the applicator device of the present invention.

In GB 234137A and in particular in FIGS. 21–24 and 35 thereof there is disclosed use of a sealing gasket or foil 55 having a continuous resiliently backed periphery defining an inner apertured region through which paste is displaced downwardly onto a stencil therebeneath. A "shoe" or spacing member 85 is provided around foil 55. Upstream of foil 55 is a higher pressure space 62 separated from a lower pressure paste space 63 by a plurality of pressure reduction spaces 61, 52' which are provided to reduce the pressure in the paste thereabove necessary to maintain the characteristics of the paste.

The above-described known continuous sealing foil with resilient backing and spacing means has been found to be exceptionally effective and advantageous.

There are also known solder paste cartridges for use in other types of paste applicator devices which devices are not entirely satisfactory and the cartridges comprise an elongate horizontally extending container of generally rectangular outline having an open top and multi-apertured bottom and in which container a similarly rectangular pressure member or piston is locatable over the solder paste contained therein. The piston is downwardly displaceable under the action of an especially designed pneumatic pressing device and mounted on a solder paste printing machine to urge solder paste contained within the container out of the apertures in the bottom of the container into the known less effective applicator device which does not have the continuous foil. In FIG. 16 by pneumatic cylinders 80 of U.S. Pat. No. 6,171,399 assigned to Novatec SA and in FIG. 1 by pressure source 2 of International Patent Application PCT/GB95/103002 of Ford Motor Company, there are examples of additional motive power means additional to the reciprocating mechanisms of the printing machine needed to expel paste from applicator device.

The present invention relates to an advantageous improved dispensing or applicator device suitable for use with existing horizontally extending containers or reservoirs or similar containers or reservoirs and also to a new, combined paste container/reservoir and applicator device which is preferably intended to be disposable after use.

According to a first aspect of the present invention there is provided an applicator device for abutment by or attachment to the horizontal and the vertical mechanical displacement/reciprocating means hitherto for the squeegee blades of a solder paste printing machine or for other viscous fluid material printing machine, said applicator device being for applying paste-like or other viscous fluid material to a surface therebeneath and comprising a body having a through passage with an upper, fluid inlet extending along the body and having a lower, fluid outlet aperture in its lower region extending along the body with a pressure reduction means between the inlet and outlet for reducing the fluid material pressure, a sealing gasket or foil for peripherally sealing said outlet against a stencil by being pressed against the stencil surface therebeneath with said gasket or foil being formed from a sheet of flexible material with a uninterrupted or continuous, non-apertured outer part extending around the periphery of said outlet and surrounding an inner aperture or apertured inner region of said gasket or foil, and an elongate, horizontally extending reservoir for fluid material formed with or detachably mounted on the upper side of said main body and extending to be in communication with said inlet of the main body or having a fluid outlet or outlets at and along its lower side in communication with said inlet of the main body, and a displaceable piston extending in said reservoir for displacing fluid out of said reservoir or outlet or outlets of the reservoir and into the fluid inlet on the main body and then via the pressure reduction means to the outlet defined by said sealing gasket or foil; said piston being accessible or actuable from above by one or more mechanical pressing members connectable to or abuttable to said mechanical displacement/reciprocating means of the printing machine for the previously removed squeegee blades so as to be displaceable thereby and said applicator device being without and not requiring any other separate motive power source for such displacement or not requiring any pipe ducting means for any such displacement motive power source (e.g. without any dedicated pneumatic or hydraulic displacement means) other than to receive mechanically transmitted displacement forces from said mechanical displacement/reciprocating means of the printing machine.

The applicator device of the invention is primarily intended to be used on a solder paste printing machine which normally has or hitherto had two squeegee blades for sliding on the metal stencil and mounted on two alternately upward/downwardly reciprocable pusher members or yokes supported by a vertical or reciprocating mechanism which itself is horizontally reciprocable on a carriage. The squeegees are removed from the yokes and replaced normally by two elongate pusher blades which alternately act on the displaceable piston of the elongate paste reservoir, preferably via a pressure distribution plate which spreads the pressure across the piston transverse to its direction of extension to minimize any backwards/forwards tilting movement of the piston. (In some printing machines, only one upwardly/downwardly reciprocating member is provided and the applicator device can be suspended therefrom.) It is envisaged that the pusher blades, for example by being curved or cam mounted or otherwise rocking, to cause an alternate tilting displacement of the piston along its length i.e. from side to side, in addition to pressing down and such sideways rocking or tilting is provided to improve/maintain the characteristics of the solder paste.

Thus, the present invention in this first aspect also includes such a solder paste stencil printing machine in combination with an applicator device according to the invention. It is to be appreciated that in such a combination, the force exerted by the pusher plates to exert a pressure and driving force not only horizontally reciprocates the applicator device and reservoir over the surface of the stencil but also exerts a downward pressure on the displaceable piston so as to provide the pressure to maintain the gasket or foil in sealing contact with the stencil therebeneath and cause the solder paste to be discharged from the reservoir and through the apertures in the stencil onto a circuit board or other electronic component or substrate therebeneath. Hitherto, separate displacing means have been provided for these purposes. It is to be appreciated that the horizontal pressure needed to slide the applicator device over the stencil and the vertical pressure needed to keep the foil in sealing relationship therewith is applied via the pusher plates horizontally and vertically via the pusher plates through the paste and is considerably more than necessary to dispense the paste through the stencil and hence it has been discovered a pressure reduction means, preferably in for form of a narrow elongate slot, is required.

Also according to a further development of this aspect of the present invention there is provided an applicator device for applying viscous or paste-like fluid material to a surface therebeneath and comprising a main body having a through passage with an upper fluid inlet and having a fluid outlet aperture in its lower region and including a sealing gasket or foil for sealing said outlet aperture against the surface therebeneath and said gasket or foil being formed from a sheet of flexible material with an uninterrupted or continuous, non-apertured outer part extending around the periphery of said outlet and surrounding an inner aperture or apertured inner region of said gasket or foil; characterised by the feature that the main body is a plate-like member which is adapted to the shape of the bottom of an elongate paste or other viscous material containing reservoir so as to be sealable thereagainst and having means for securing such to the reservoir, and that said upper fluid inlet is an elongate opening extending along a major portion of the length of the housing.

In a still further development of the present invention, the main body and viscous-material containing reservoir and outlet sealing means are formed as a unit or integrally and comprise an elongate horizontally extending, viscous material reservoir open at its top and having an elongate, horizontally extending, vertically or substantially vertically displaceable piston sealingly slidable in the reservoir, and an elongate, horizontally extending opening or other opening or openings in the bottom of the reservoir forming outlet means and pressure reduction means for the viscous material as it is urged donwardly by the piston, and in which the peripheral side of said opening or openings is of flexible material and extends downwardly and forms a sealing surface of flexible material which surface extends as an uninterrupted or continuous, non-apertured outer portion extending around the periphery of said outlet opening or openings and sealingly engageable or abuttable with the surface of a stencil therebeneath, and spacing means extending downwardly from the bottom of said reservoir and outwardly of said sealing surface on at least two opposite sides to limit the amount the sealing surface is flexed upwards when pressed against a stencil surface therebeneath.

Also according to the present invention there is provided, in combination, a solder paste screen printing machine including first reciprocating means for effecting reciprocating displacements in a horizontal direction and carrying a second reciprocating means for effecting vertical or upward/downward reciprocating movement of one pressure member, or for effecting vertical or upward/downward movements, alternately, of two pressure members, and a paste applicator device including a solder paste reservoir with paste displacing member above the paste displaceable under the action of such pressure member or members for displacing paste downwardly through paste pressure reduction means forming part of the device to an outlet sealingly slidable, in use, over a supporting printing stencil, wherein said pressure member or said pressure members provide the downward pressure via the intermediary of said paste to effect sealing of the applicator device against the stencil and act on the applicator device to effects said horizontal displacements thereof.

In leading to a further development, it has been found that with certain solder paste screen printing machines using the above-mentioned applicator device or other applicator devices, and especially with more sophisticated machines having pressure feed-back loop systems or closed loop feed-back systems, the pressing member or members are normally not able to effect the necessary range of downward displacement to move the piston for the sufficient amount since such machines are initially set-up for only a limited amount of vertical displacement and when such amount is exceeded (which normally indicated the wearing of a hitherto, known squeegee blade), the printing machine cuts off and ceases to operate. Whilst this cut-off feature can be overridden and the machine reactivated, the process, it can prove troublesome and it is an object of a further aspect of the present invention to provide an adaptor device which will enable applicator devices and/or elongate reservoirs for solder paste including a displaceable elongate piston to be readily displaced by the pressing members of a large range of solder paste screen printing machines.

The further aspect of the present invention provides a simple form of adaptor that is purely mechanical and does not require any power source (such as pneumatic, hydraulic or electric) other than the downward force exerted by the pressing member or members of a solder paste or other viscous fluid printing machine which may have hitherto carried the known squeegee blades for solder paste. Also in some cases, the back pressure exerted on the printing machine can cause damage to the machine.

According to a broad second aspect of the present invention there is provided an adaptor device for enabling a solder paste or other viscous fluid material applicator device, which is for receiving or includes an elongate solder paste or other material reservoir containing an elongate piston displaceable therein for displacing the solder paste or other material, to be acted upon by the one or more vertically displaceable pressing members of a solder paste or other material screen printing machine, comprising a preferably elongate piston pressing member locatable on the piston of the elongate reservoir and connected via at least one one-way movement enabling device to a preferably elongate pressure receiving member which is to be acted upon by the pressing members of a screen printing machine in a downward direction, with said one-way movement enabling device only normally permitting movement of said pressure receiving member in an upward direction away from said piston pressing member and wherein with every downward displacement of the piston pressing member and receiving member, solder paste contained within the reservoir is urged downwardly and out of said reservoir, said pressure receiving member being biased away from said pressing member so as to be displaced upwardly to its original position following each downward displacement thereof.

The surface of said pressure receiving member which is engaged by said pressing member of the printing machine is preferably of or at a height or displaced to a height such that in operation the downward displacement of the pressing members of the screen printing machine does not exceed that as may be permitted by the machine for normal operation without stopping of the machine. Thus, it is important the maximum downward displacement of the pressing member and the pressure receiving member during each downward stroke of the machine will not exceed that permissible for the normal range of movement of the pressing members of the printing machine which is normally its amount of expected flexing of known squeegees e.g. about up to 3 mm likely 0.5 mm, i.e. within normal tolerances. For the first downward displacement of the pressure receiving paste or other fluid, the applicator and adaptor device are such that the back pressure in the paste will act to safely limit the downward movement of the machine. The return of the pressure receiving member to its original height and the operation of the one-way movement enabling device will ensure the maximum downward movement of the machine is not exceeded.

The maximum spacing between the piston pressing member and the pressure receiving member is preferably achieved by two spaced apart projections extending from the pressing member and each through an aperture thereabove in the pressure-receiving member to also act as a guide means and has an enlargement (such as the head of a threaded member or projecting captive metal balls of a quick release device) which limits the amount said two members may be biased apart. The two members may be optionally separated when changing reservoirs (by detaching the threaded members or retracting the balls of the quick-release device).

Preferably the one-way movement enabling means is a ball-lock (preferably with a annular taper of 5° per side i.e. a 10° included angle) and has the advantage over one-way step-wise or graduated ratchet devices of enabling movement in one direction of any desired amount. Each ball lock is preferably releasable by screwing down or pressing down a ball displacement cap which displaces the balls downwardly to disengage the balls from the taper and enable movement in two directions.

The pressure receiving means of the adaptor device will normally rest on top of the paste reservoir or be biased to a position thereabove and the pressing member acts on the piston of the paste reservoir and is displaced downwardly by force being transmitted from the pressing member of the paste printing machine onto the pressure receiving member (the device sometimes referred to later herein as the "incremental cap") and then the one-way movement enabling device, to the piston pressing member.

The piston pressing member is preferably elongate and coextensive with the piston of the reservoir and the connection between the two members guides the piston pressing member such that any tendency for the piston to tilt (erratically about its horizontal traverse axis) is minimised or reduced.

In a broad second aspect of the present invention there is provided an adaptor device for enabling a paste or other viscous material applicator device for receiving or including an elongate solder paste reservoir containing an elongate piston displaceable therein for displacing the solder paste to be acted upon by the vertically displaceable pressing members of a solder paste screen printing machine, and said adaptor device comprises a pressure receiving member locatable on the elongate reservoir and/or the piston of the applicator device and to be acted upon by the pressing members of a screen printing machine in a downward direction, and piston displacing means which moves downwardly with said pressure receiving member and which cause the piston to be displaced downwardly when said pressure receiving member is acted on by said pressing members to urge solder paste contained within the reservoir downwardly; the surfaces of said adaptor device which are engaged by said pressing members of the printing machine being of or at a height or displaceable within a limited range such that, in operation, the downward displacement of the pressing members of the screen printing machine does not exceed that as may be permitted by the machine for normal operation without stopping of the machine. The downward displacement is limited by the back pressure of the viscous material as only a small amount of the viscous material is dispensed during each pass of the applicator device on the machine.

The invention will be described further, by way of example, with reference to the accompanying drawings, in which:

FIG. 3 is a perspective view of the device of FIG. 2 from above and one side and with one of the pusher plates being removed to show the castellated bottom pressure distribution plate of the remaining one;

FIG. 4 is a view similar to FIG. 3 wherein the upper, reservoir-clamping and reinforcing member has been removed;

Figure 9:
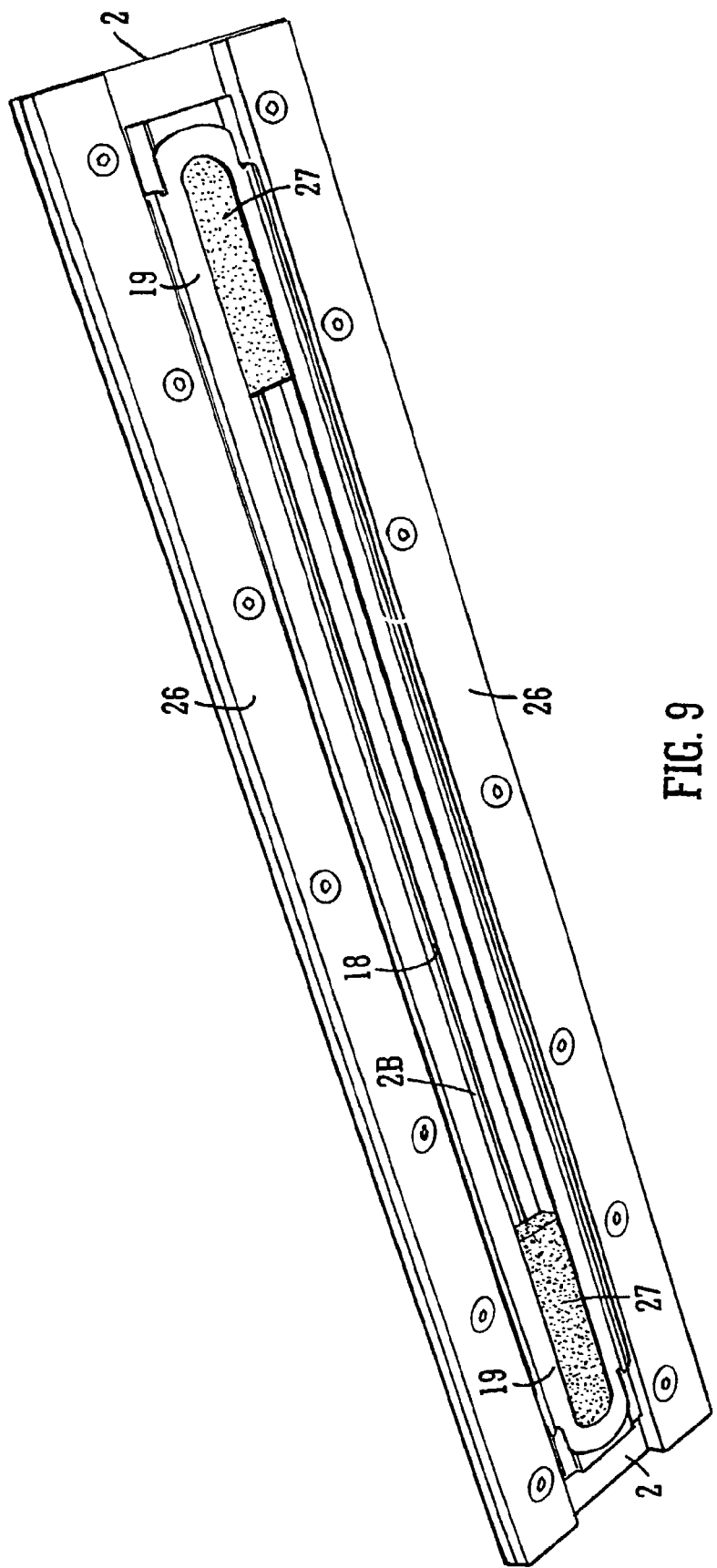

FIG. 9 is a perspective view from below showing the bottom of the main body of the applicator device (without the components attached to the upper side of the main body and comprising the reservoir, clamping housing and pusher plates) and showing the outer lateral spacing members with the continuous sealing foil therebetween and overlying the continuous O-ring with the central pressure reduction slot and end blanking members.

Figure 10:
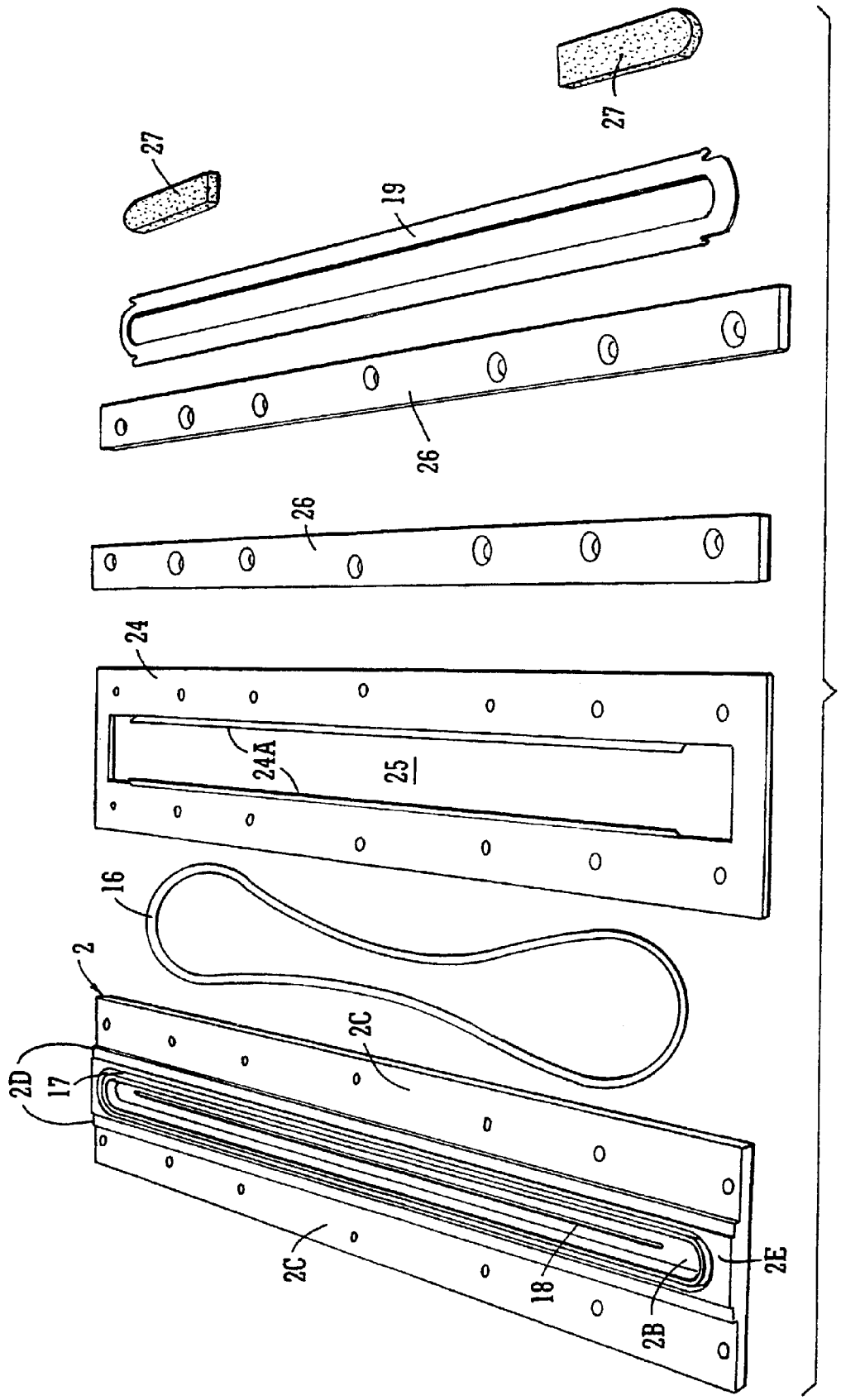
Figure 11:
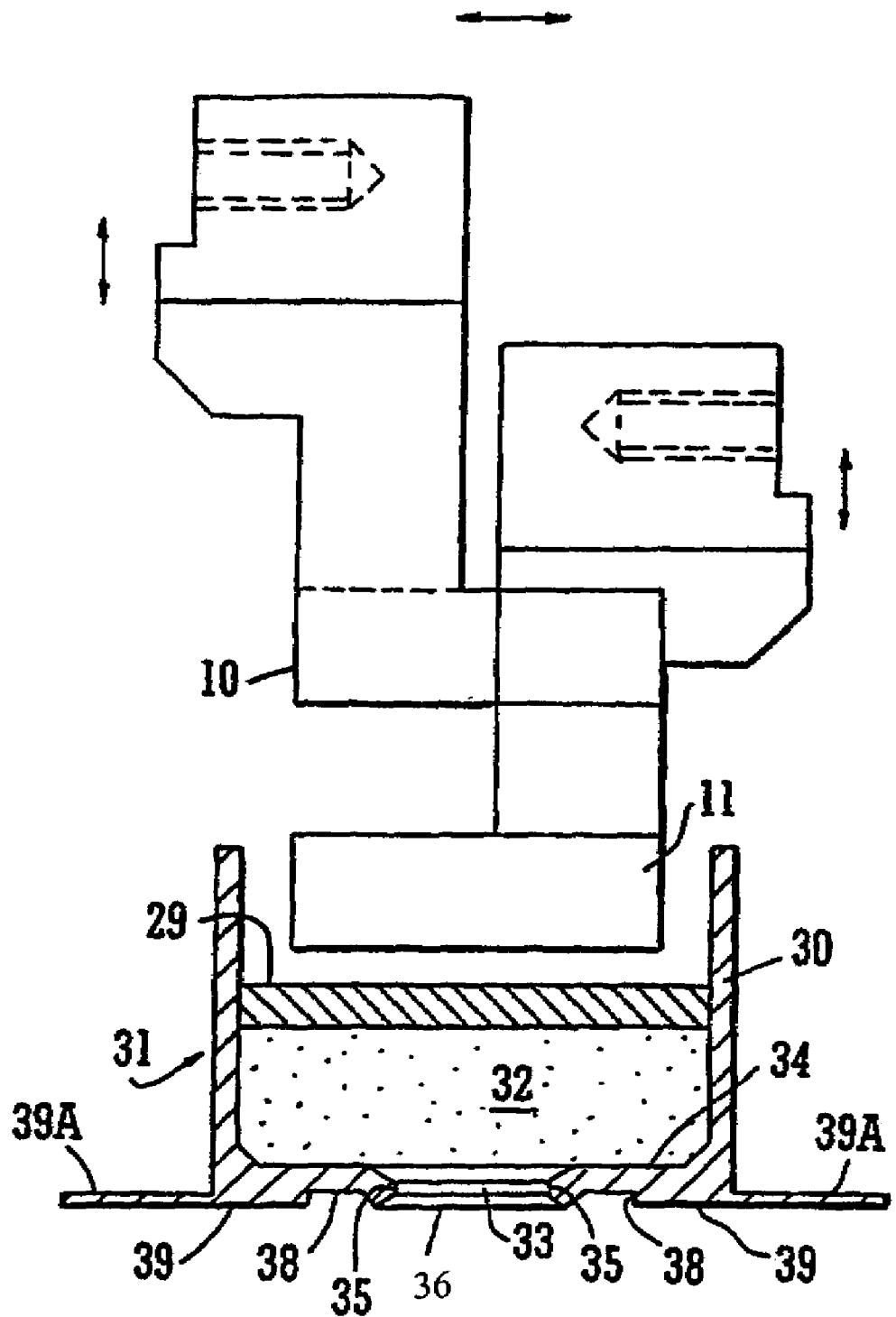
Figure 13:
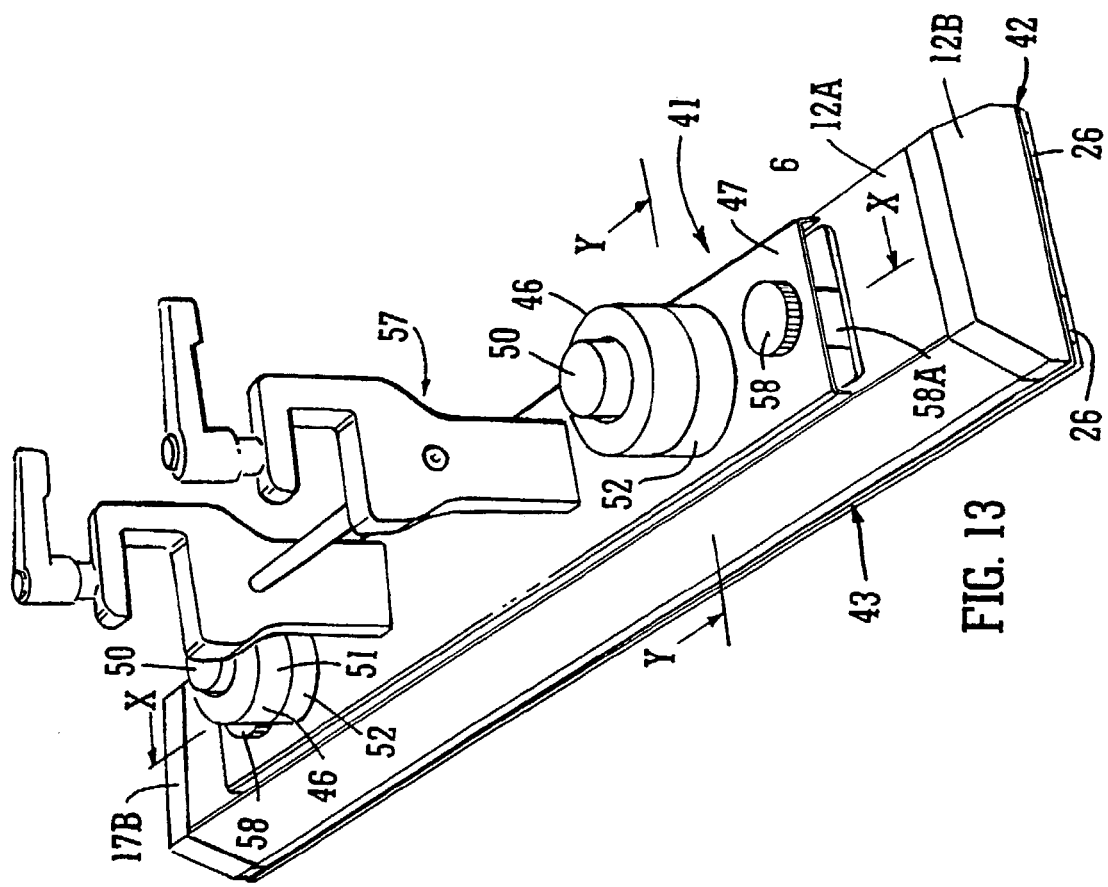
Figure 12:
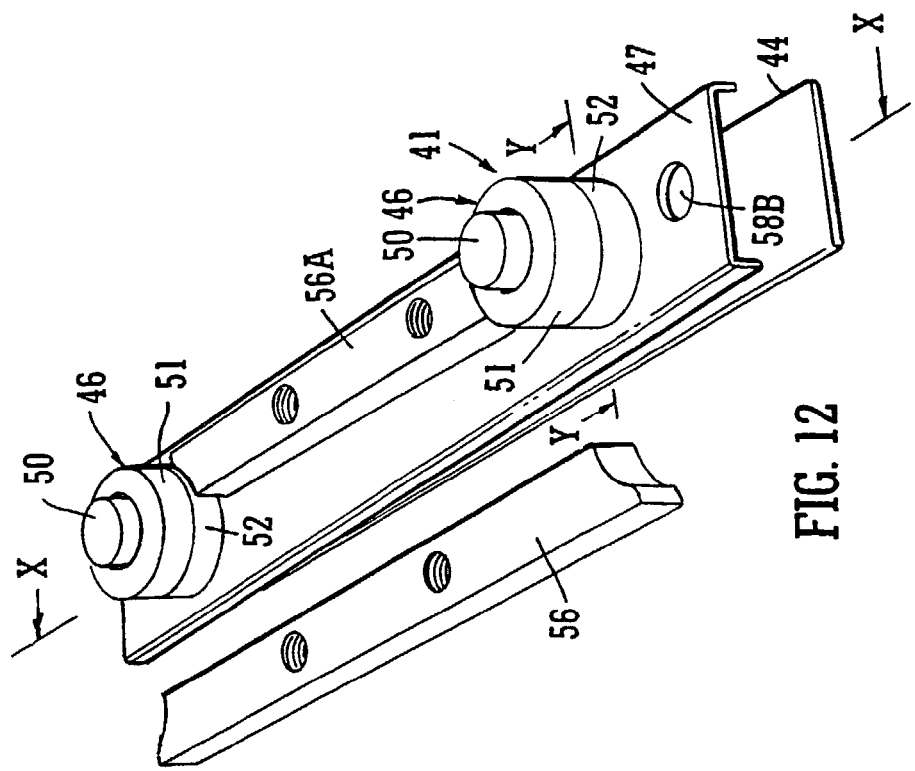
Figure 14:
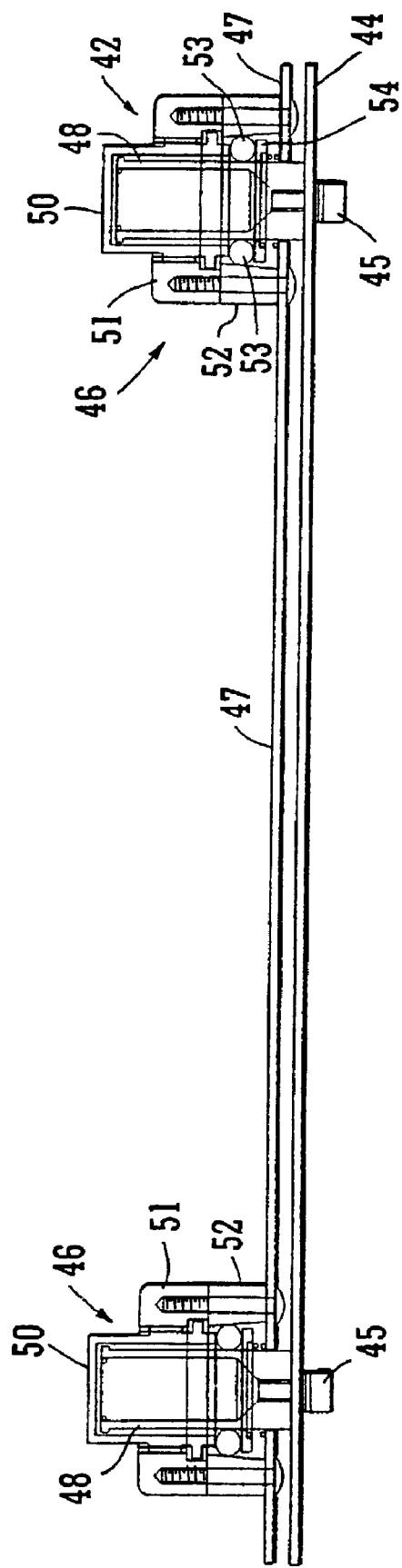
Figure 15:
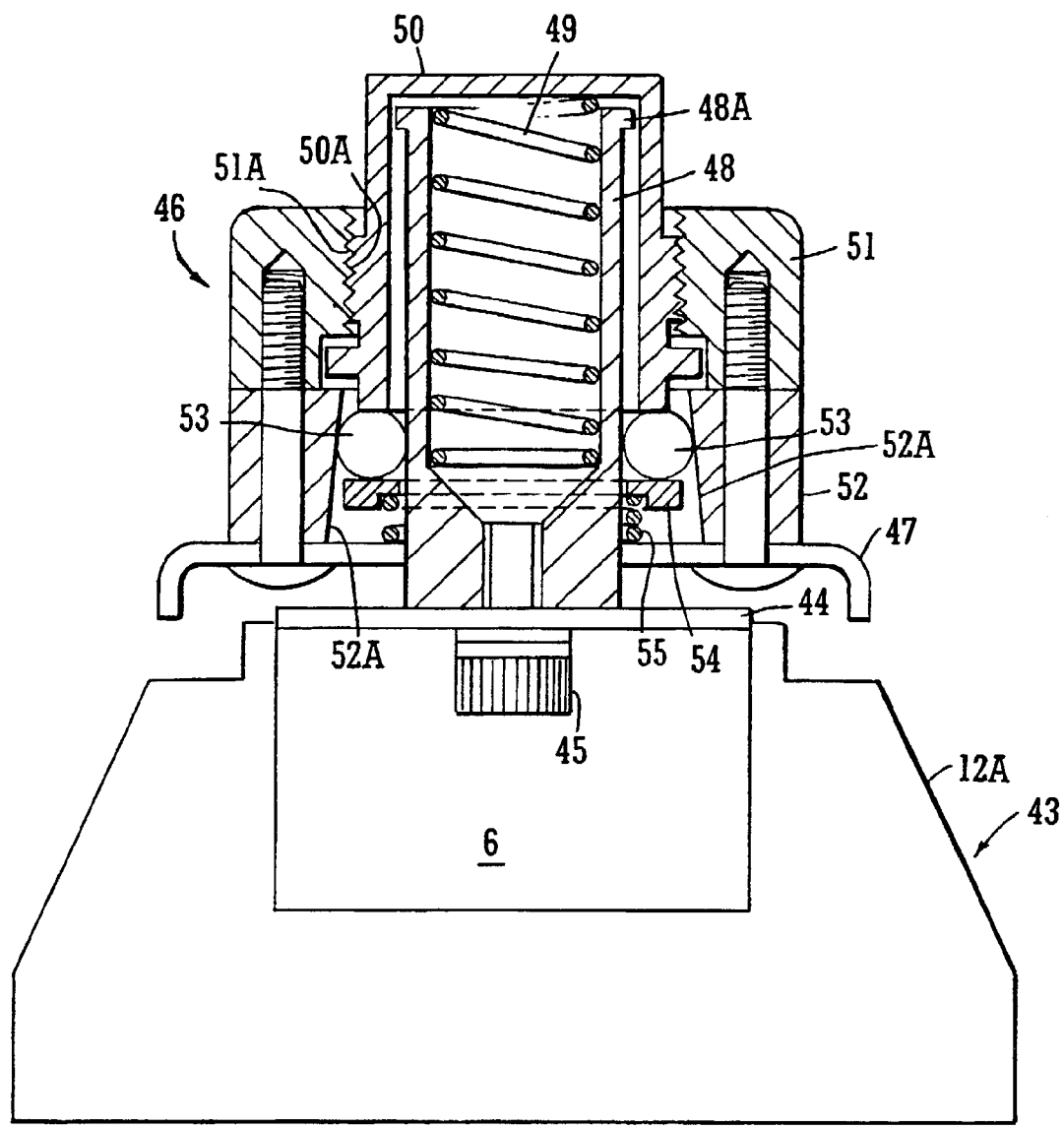
Figure 16:
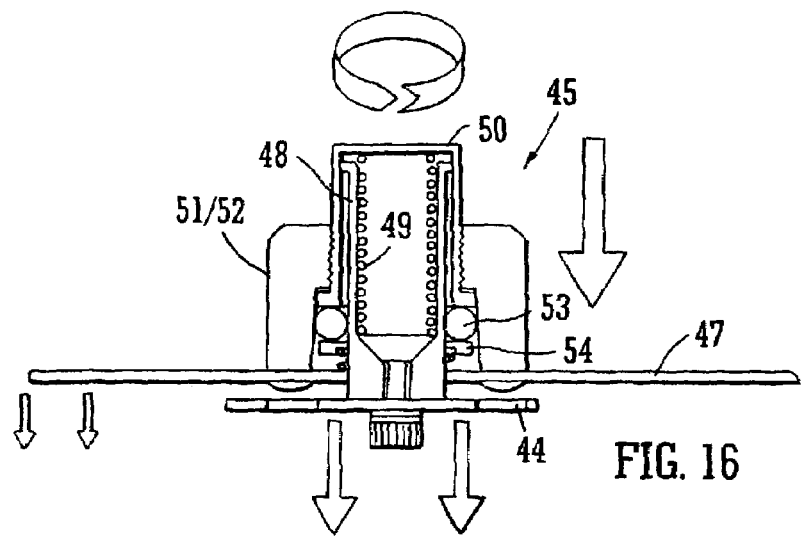
Figure 17:
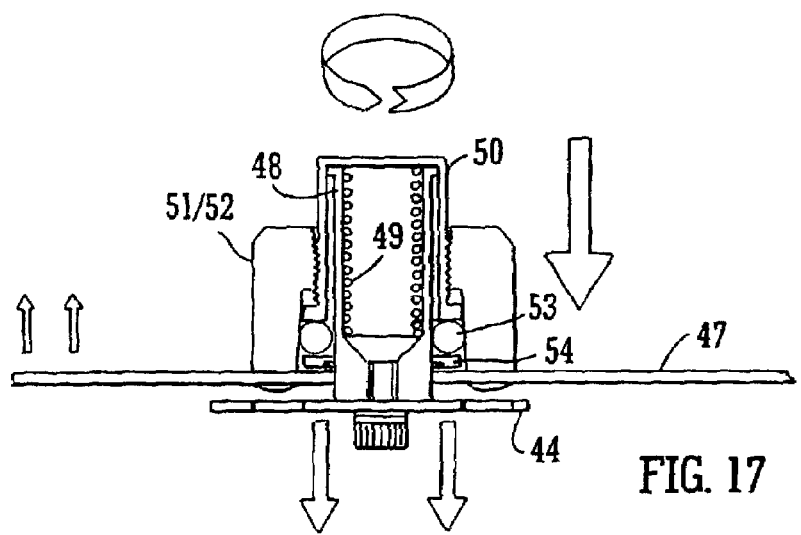
Figure 18:
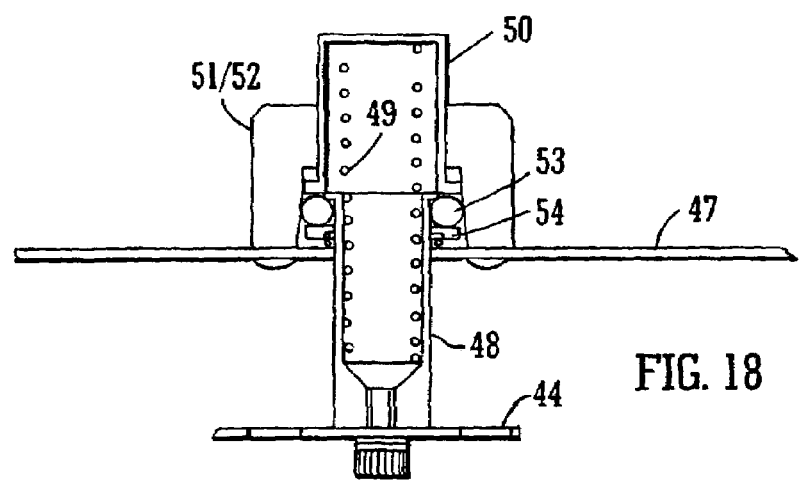

FIG. 10 is an exploded perspective view of the separated components of the parts of FIG. 9 comprising the bottom of the main body plate and the parts connected thereto;

FIG. 11 is a schematic sectional view through an alternative embodiment of the invention wherein the pressure reduction means and the continuous sealing foil means are integrally formed in the bottom of the paste reservoir cartridge as are the lateral spacing shoes;

FIG. 12 is a perspective view from above and one end of a working version of the an embodiment of the adaptor device according to the second aspect of the invention and showing two pressing bars, one separated and on its side, connectable to the alternate upward/downward movement devices of the machine;

FIG. 13 is a perspective view from above and one end of the device of FIG. 12 i.e. a solder paste reservoir in an applicator device with an especially hook-like mounting arrangement with securing levers centrally for enabling mounting on a specific paste printing machine;

FIG. 14 is a schematic sectional illustration on line X-X of the adaptor devices of FIGS. 12 and 13 (without mounting devices) showing the elongate extension of the piston pressing member and pressure receiving member and the spacing of the two one-way movement enabling devices in their starting positions (as FIG. 16) prior to any stepping of the piston pressing member away from the pressure receiving member;

FIG. 15 is an enlarged schematic end section on line Y-Y through an adaptor device and one of the two one-way movement enabling devices according to one embodiment of the invention and located on an applicator device and an elongate solder paste reservoir; and FIGS. 16 to 18 are schematic illustrations of the various operational conditions of an adaptor device similar to that of FIGS. 14 and 15.

Figure 1:
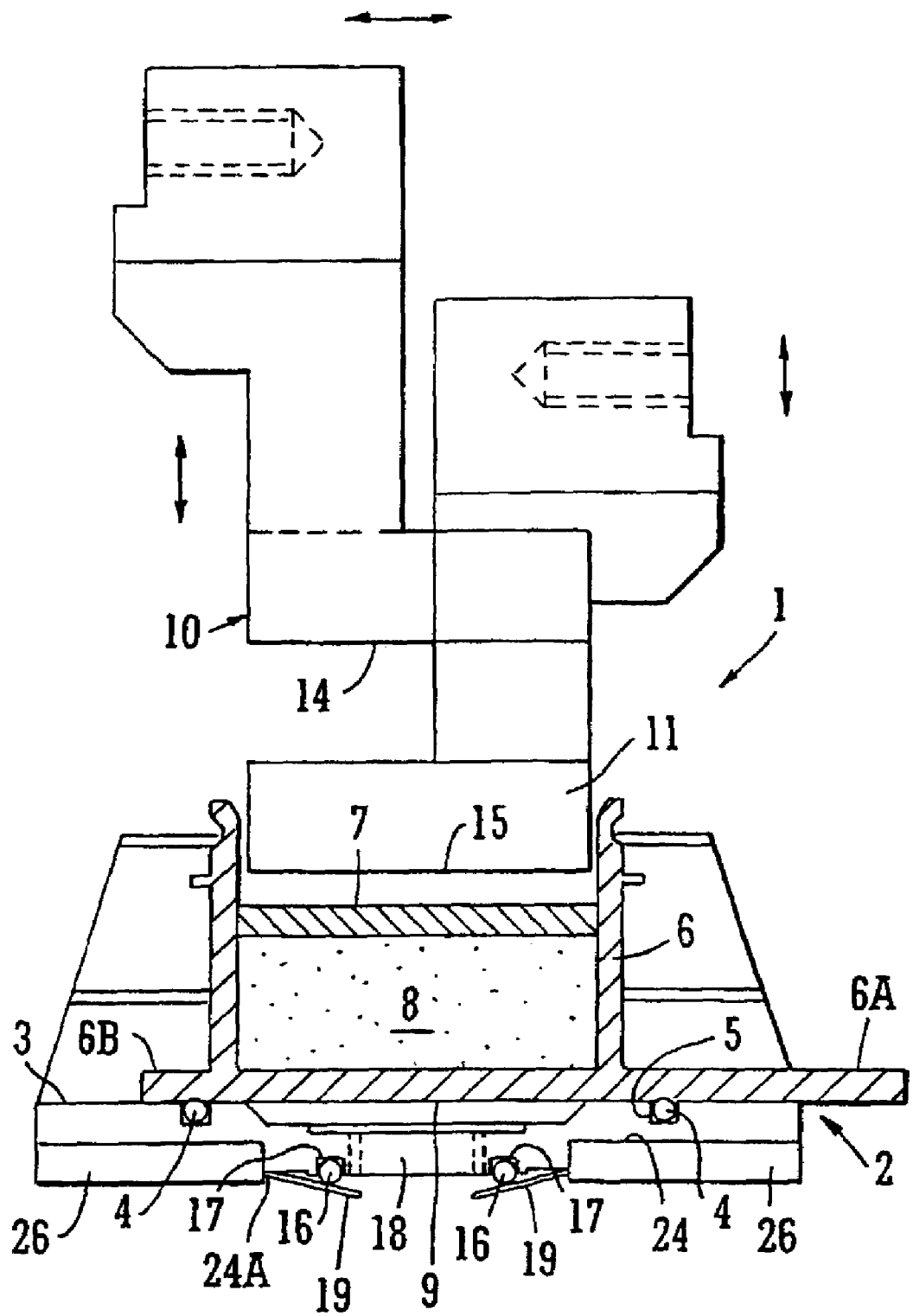
FIG. 1 is a schematic cross section through a first embodiment of the invention.
Figure 2:
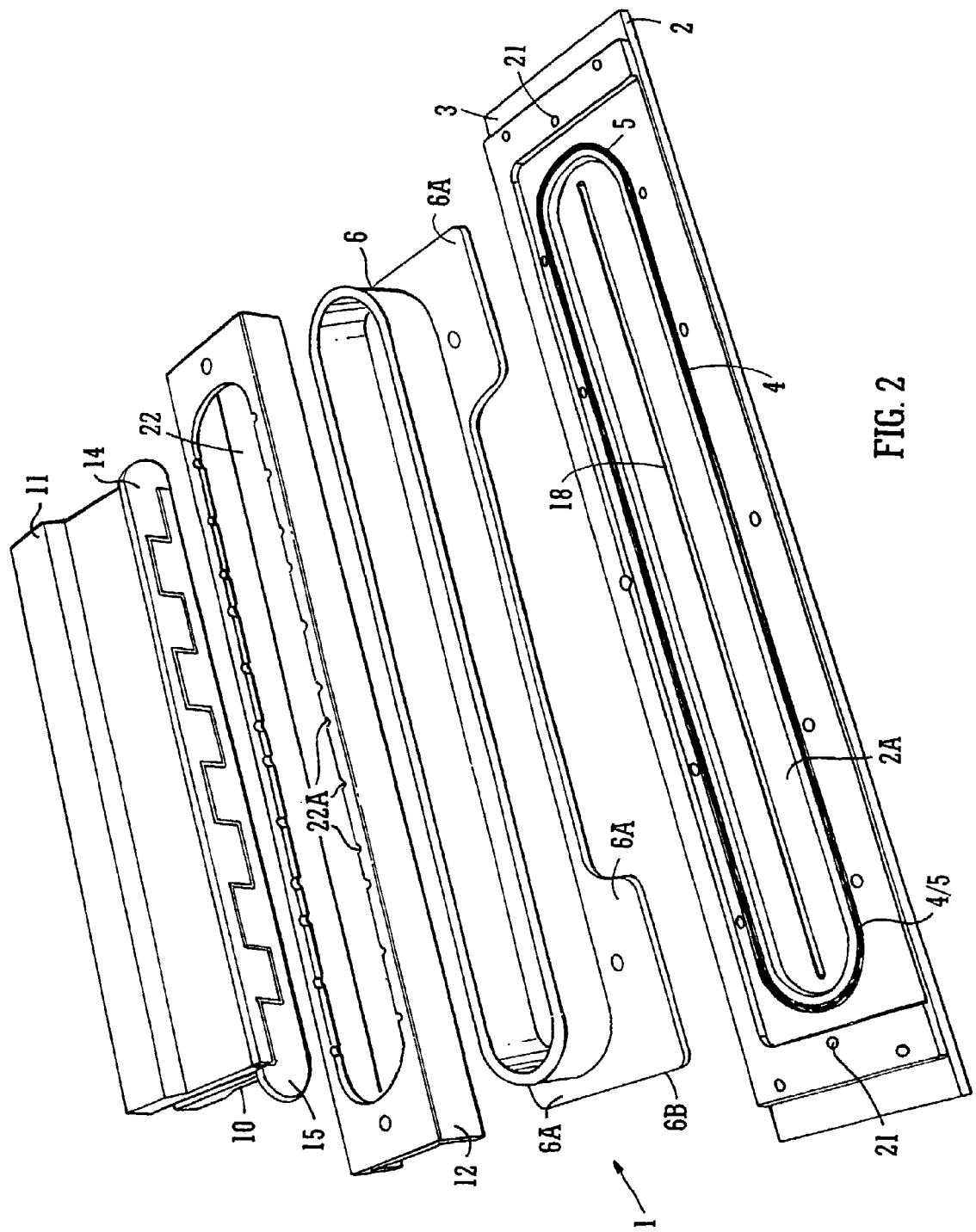
FIG. 2 is an exploded view from above of the separated component parts of an embodiment of the invention as a practical realisation of the schematic embodiment of FIG. 1 including the top of the main body plate and parts thereabove of the applicator device of FIGS. 2 and 5.

In FIG. 1 a solder paste applicator device 1 is illustrated and includes a main body or base plate 2 having an upper side 3 with continuous groove 5 in which a sealing O-ring 4 is located in and on which the upper side 3 an elongate, horizontally extending solder paste reservoir 6 in the form of a replaceable cartridge is located and the bottom flanges 6A having abutting against upstanding shoulders and being clamped in position by a surrounding channel-like clamping member 12 (in FIG. 2) (but not shown in FIG. 1) screwed to base plate 2. The paste reservoir 6 of plastics material has sealingly slideable therein a generally horizontally extending elongate piston 7 (only shown in FIG. 1) also of plastics material which rests on the upper surface of solder paste 8 and one or a plurality of outlet apertures (not shown) are provided in the bottom 9 of reservoir 6 and through which paste may be discharged therefrom under the action of pressure on piston 7—said pressure being alternately applied by two generally L-sectioned drivers or pusher plates 10, 11 which act as pressure transmission means from a screen-printing machine (not shown). The pusher plates 10, 11 are each mountable in place of known squeegee blades (with reference to FIG. 20 of GB 2341347) which have been hitherto mounted with the yokes of a known vertical reciprocating mechanism (not shown) and carried by a reciprocably displaceable carriage of a solder paste screen printing machine. (With reference to FIG. 20 of GB 2341347, the present pusher plates 10, 11 take the place of known adapter blades 83, 84 and would be mountable on yokes 78, 79 of the vertical reciprocating mechanism 79 carried by carriage 74 of a screen printing machine.)

In FIGS. 2–10 the same or similar reference numerals are used as in FIG. 1 i.e. for similar parts, although a clamping member 12 is illustrated in the form of an inverted U-shaped channel member 12 (FIGS. 2 and 3) which has a central aperture shaped to closely surround the outer sides of the paste reservoir 6 so as to provide lateral support against outward bulging of the walls of the reservoir because of the pressure of the paste and also to clamp the reservoir 6 against the main body or base plate 2 by means of two threaded members 13 extending through apertures therein and engageable in threaded bores 13A (only one shown) in body 2 on spacer thereon.

Figure 5:
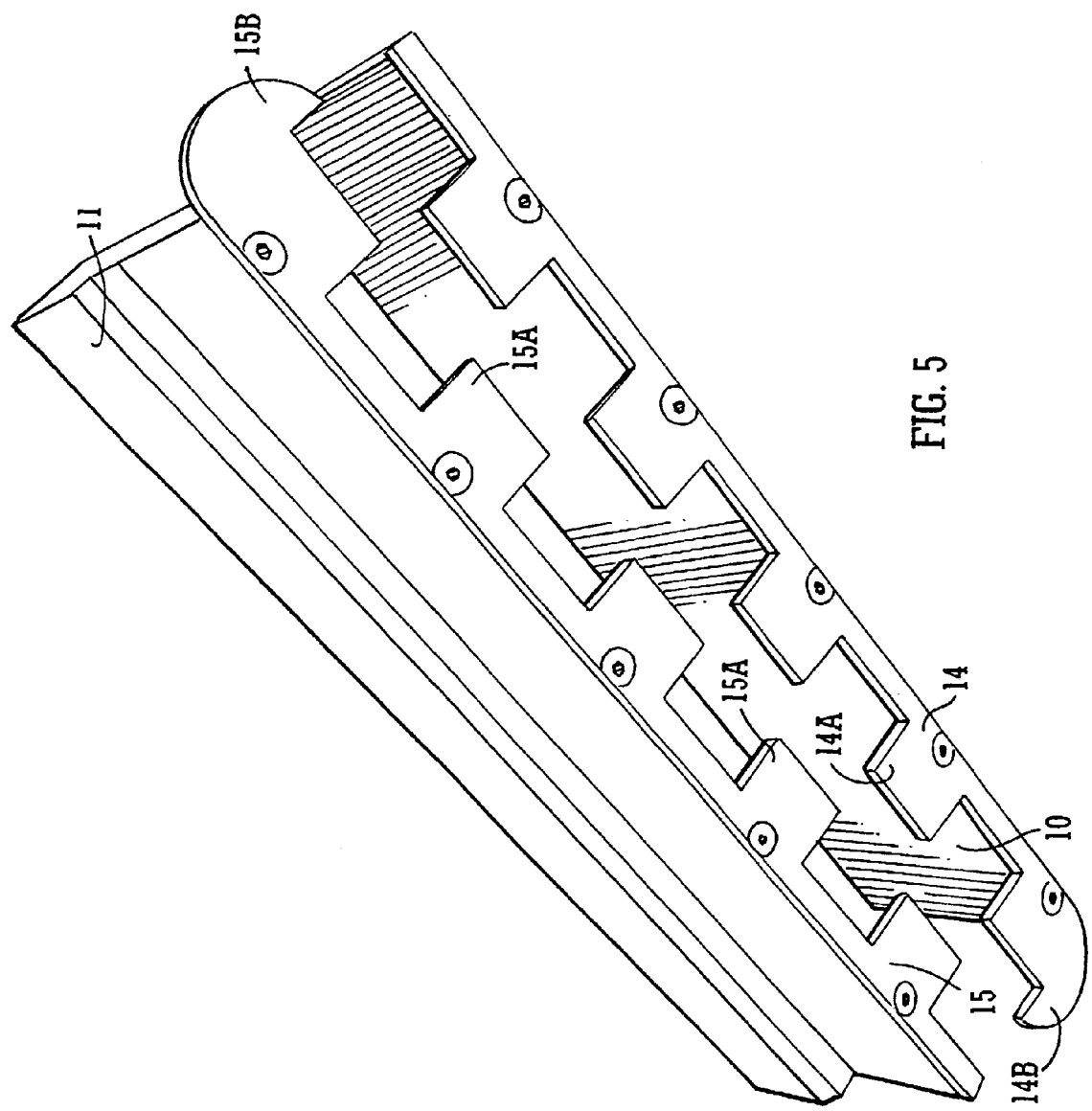
FIG. 5 is a perspective view from below of the upper pusher plates wherein the castellated pressure distribution plates (normally at the bottom) are shown juxtaposed prior to interdigitation.
Figure 6:
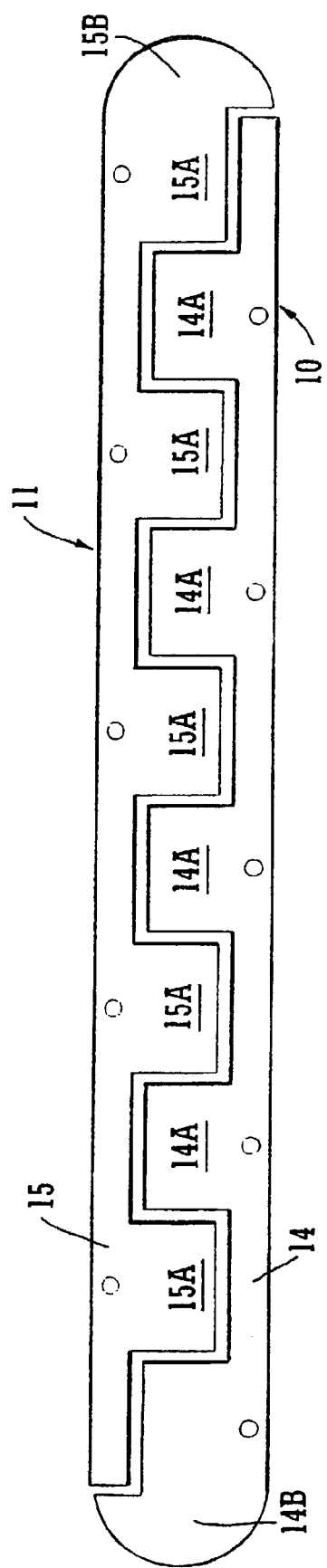
FIG. 6 is an inverted plan of the pusher plates of FIG. 5 and interdigitated pressure distribution plates.

In FIGS. 3 and 4 one of the pusher plates 11 has been omitted so as to reveal the remaining one 10 which comprises an upper part 10A which is securable to the carrier member (not shown) of the reciprocating mechanism of the solder paste screen printing apparatus and extends downwardly to fit into one part of the paste reservoir 6 and has at the bottom thereof a pressure distribution plate 14 secured by screws and having a plurality of horizontally extending rectangular flanges 14A or castellations which extend partway across the body of the elongate paste reservoir cartridge 6 and interdigitate with similarly but offset projecting flanges 15A of distribution plate 15 of the opposite pusher plate 11—see FIGS. 5 and 6 in this connection wherein the pusher plates have been inverted to illustrate the interdigitation of the projecting flanges 14', 15' of the pressure distribution means 14. The ends 14B, 15B of each of the distribution plates 14, 15 are rounded to conform with the shaping of the interior walls of the cartridge.

The bottom of the inverted channel section 12 which clamps the reservoir in position extends through a number of spacer plates and onto the main body 2.

In FIGS. 2–8 the upper components of the device 1 are illustrated comprising the main body 2 having the continuous groove 5 with a circular cross-section O-shaped sealing ring 4 located therein to extend thereabove and to be in sealing abutting relationship with the bottom 6A of the paste reservoir 6 and the outlets therein. Main body 2 has a recessed inlet portion 2A surrounded by the groove 5 for receiving paste from reservoir 6 and has a narrow central slot 18 extending axially therealong which forms a pressure reduction means for paste urged out of the reservoir 6 and leads to the outlet portion 2B in the underside of the main body 2 and into the space defined peripherally by the lower sealing foil 19. Shoulder portions 20 are provided in the top of the main body 2 and against which the flanges 6B at the bottom of the paste 6 reservoir fit so as to be located there and the inverted U-shaped section clamping member 12 is located thereover and secured by threaded securing means 13 passing through holes therein and into threaded apertures 21 in the opposite ends of the main body 2.

The central paste reservoir encircling aperture 22 of the clamping member 12 has plurality of notches 22A around its edge which accommodate reinforcing ribs 6C in the outer sidewalls of the paste reservoir 6 and the clamping device 12 can securely clamp the bottom flanges 6A, 6B of the reservoir against the bottom body plate 2. Additional reinforcing means (not shown) to prevent outward bulging of the main walls of the reservoir 6 may be provided. The paste displacing piston 7 lies within the paste reservoir 6 and is of similar corresponding shape to the inner walls thereof and extends therealong.

Figure 7:
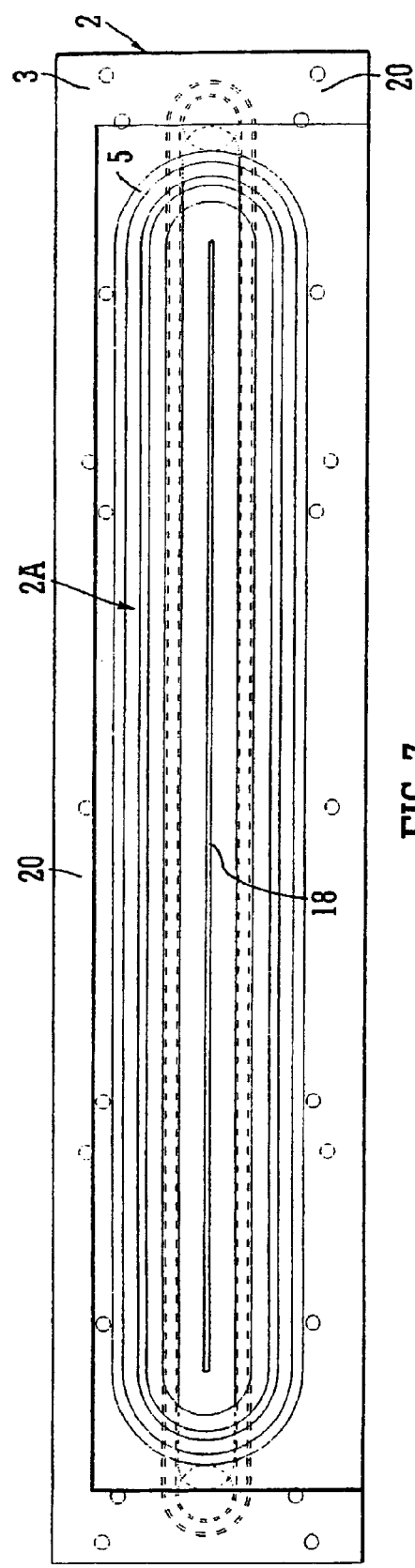
FIG. 7 is a line drawing plan from above of the main body of FIG. 2 showing the groove for a sealing O-ring for sealing with the reservoir and the central pressure reduction slot.
Figure 8:
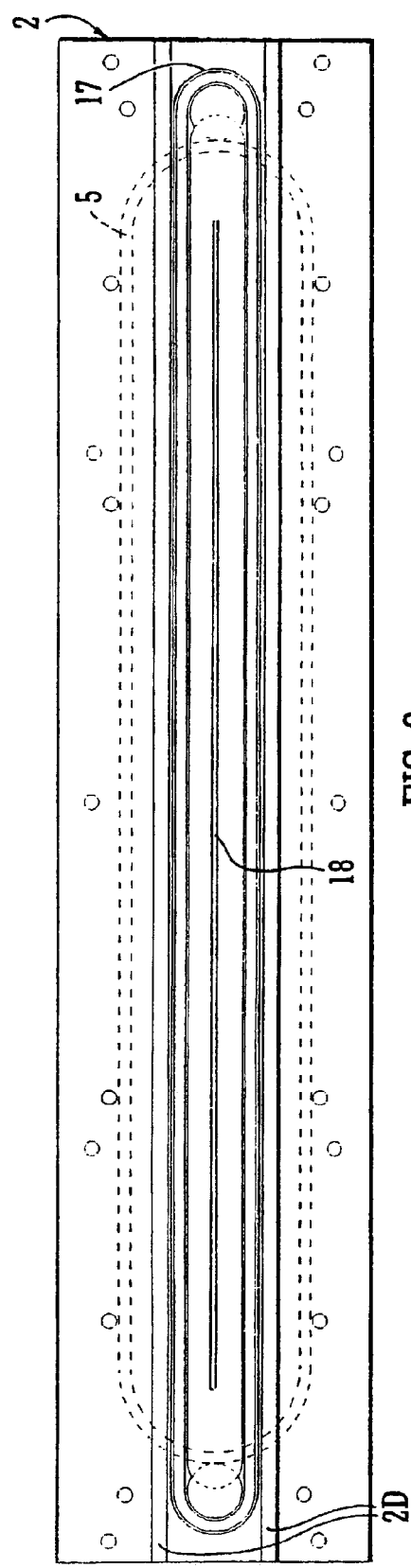
FIG. 8 is a plan view from below of the main body of the device of FIGS. 2 and 7.

FIGS. 7 and 8 are a plan and underneath plan of the main body 2.

FIG. 9 is an underneath perspective view of the main body plate 2 and components attached thereto. The lower side of main body plate 2 has elongate side faces 2C (for receiving spacing plates or shoes 26) and then, inwardly, two step or shoulder portions 2D and a bottom surface 2E is provided for O-ring 16 and inwardly thereof the apertured outlet portion 23 is provided. FIG. 10 shows the components of FIG. 9 separated and these might be described with reference to the assembly/location stages relative to the bottom of the main body plate 2 as follows. First the lower resilient rubber sealing O-ring 16 is located in the groove 17 and projects thereabove or therebelow in use. Then a foil retaining plate 24 is located by suitable means on the main body plate 2 and has inclined lateral lips or edges 24A facing each other on either side of the inner aperture 25 and which are to retain the continuous sealing foil 19 as will be described subsequently. (It is envisaged that prior to location of the foil retaining plate 24, an additional continuous resilient member (not shown) may be clamped thereunder with edges abutting lower than the crown (normally above the crown) of the O-ring in use so as to prevent solder paste accumulating laterally outwardly of the O-ring) Subsequently the two spacer plates 26 or "shoes" are located with screws laterally either side of the central elongate aperture 2B with the pressure reduction slot 18 in the middle and the combination screwed together to the bottom of the main plate 2 to hold such in position. Then the continuous resilient sealing gasket or foil 19 (similar to that as described in GB 2341347A) is flexed and inserted and located so as to be retained by the side edges 24A of the foil retaining plate 24 and abutting against the resilient O-ring 4 to form a good seal therewith when pressed against a stencil (not shown) located therebeneath. End stops or blanks 27 are of resilient material may be located either end of slot 18 and held to restrict an outward flow of paste of the ends and may be of adjustable or of variable length or different length to accommodate for different widths of aperture arrangements in the stencil (not shown) to be used for a printing operation.

In use with the paste reservoir 6 containing solder paste 8 and the piston 7 being upwardly disposed within the inside of the reservoir on top of the paste 8 and the pusher plates 10 and 11 screwed to the vertical reciprocating bars (not shown) of the reciprocating mechanism of the screen printing machine (not shown), and with the reservoir 6 and attached bottom plate 2 and components therebeneath such that at the commencement of one operating cycle of the printing machine, one pusher plate 10 is raised and the other 11 is lowered to press against the piston 7 and urge paste out of the reservoir 6 through the one or plurality of bottom apertures 9 in the bottom and through the pressure reduction slot 18 into the space defined between the inner surfaces of the sealing O-ring 4 and edges of the resilient gasket or foil 19 which has been flexed. The foil 19 has been flexed upwardly by being pressed against the upper surface of the stencil (not shown) therebeneath and which is to have the solder paste pressed therethrough to be printed. The pressure on the device 1 is exerted by the vertical reciprocating mechanism (not shown) of the screen printing machine via the pusher plates 10 and 11 and this not only pressurises the paste 8 but also via the paste acting on the reservoir bottom and/or the bottom plate 2, presses the lower parts of the applicator device 1 against the stencil and into peripheral sealing engagement with it via the sealing foil 19. The spacer shoes 26 on either side limit the upward deflection of the foil 19 and may be of a material such as PTFE or other preferably slidable material (and may even be a plate surrounding a slot therein).

The stenciling operation is then effected by the printing machine moving horizontally and carrying with it the applicator device 1 to the end position whereupon for the next stroke the pusher plate 11 is raised and the pusher plate 10 lowered to act against the piston 7 and a horizontal displacement then takes place in the opposite direction in a similar manner with plate 10 pressing the device 1 against the stencil to form a seal with the gasket or foil 19 thereagainst and also causing the horizontal movement again by horizontal pressure against the walls of the reservoir 6.

It is to be appreciated that unlike hitherto known devices having motive power means or devices separate of the machine for displacing the paste, the pressure in the present invention is applied via the pusher plates 10 and 11 and not only exerts pressure on the piston 8 so as to drive the solder paste out of the reservoir 6, but the applicator device 1 is constructed and arranged such that this downward pressure is also transmitted via the paste 8 through the components of the body 1 and to the shoes 26 and causes the necessary pressure for sealing of the foil 19 against the stencil surface and, furthermore, by acting against the side walls of the reservoir 6, also effects the displacement in horizontal directions of the applicator device over the stencil. Thus no separate pressurisation device for the paste 8 is necessary other than the mechanical forces from the reciprocating mechanism of the printing machine. As a consequence of this two-fold pressure application, greater pressure is exerted on the paste than is actually necessary to displace such out of the reservoir and through the apertures in the stencil therebeneath and is of such magnitude as would otherwise create problems in printing in that the paste would be forced into undesirable regions and leak. It has been found necessary to provide the pressure reduction means for the paste 8 which in the example shown is in the form of a narrow slot 18 formed within the main body plate 2 although such may be provided as a separate component seatable in a larger slot on shoulders thereof and thus would enable the pressure reduction to be varied dependent upon the paste condition etc.

It is also envisaged that the condition of the paste within the reservoir 6 might be improved as a result of a tilting or rocking motion of the piston 4 about an axis generally transverse to its longitudinal direction of extension and this may be created by the construction or operation of the pressure plates 10 and 11 For example, they might have oppositely, inclined or curved surfaces or a "crown" or a cam arrangement or other device to create this additional alternating or tilting action in opposite directions for each stroke which will be transverse to the normal horizontal direction of a movement during a printing operation.

Whilst not shown, the paste cartridge 6 might normally have a plurality of very large paste outlet apertures or a single elongate slot in the bottom which are/is not such as to cause any significant reduction in the pressure thereof and such normally have on the lower surface, a removable foil which is removable prior to use to enable the paste to flow out thereof. It is also envisaged as a possibly preferred modification of this embodiment for the paste reservoir to be provided integrally formed or otherwise on the maid body plate 2 as an upstanding continuous wall surround the slot 18 and providing interrupted flow thereto. In this arrangement, the main body plate with reservoir would be returned for recharging.

In FIG. 11 an alternative embodiment is illustrated comprising an integrally formed or mainly integrally formed plastics material applicator device 28 having similar pusher plates 10 and 11 as attachments which are simply provided to adapt an existing screen printing machine in place of the squeegee blades thereof so as to enable the vertical and horizontal reciprocating mechanism to act upon the paste cartridge piston 29 and side walls 30 of the reservoir 31 for solder paste 32 to effect the necessary displacement. In the embodiment of FIG. 11, which is illustrated schematically, it is envisaged that main components of the applicator device be integrally formed in that the paste reservoir 31 has an elongate slot 33 in its bottom acting as a pressure reduction means for the paste 32 being expelled therefrom and the side walls 35 defining the pressure reduction slot or portions extend therebeneath and are resilient so as to define a continuous surface 36 surrounding the lowermost aperture 33 in the bottom wall 34 so as to provide a sealing surface 36 against a stencil when located therebeneath and when pressed thereagainst and will have a degree of resilience to enable such seal to be effected. Laterally on either side of the resilient surfaces 36 forming the seal, there is a recess 38 and then shoulders or downwardly extending spacing projections 39A which are equivalent to the spacing "shoes" 26 of FIG. 10 and which will slide on the surface of the stencil. There are also extensions extending in opposite direction on either side to provide stability for the sliding movement and will limit the upward deflection of the resilient surfaces 36 when the device 28 is pressed against the stencil surface. Otherwise, the piston 29 and members 10,11 etc. will be similar to that already described and be downwardly displaceable to press paste out of the reservoir cartridge. This arrangement has particular advantages in that the whole unit may be disposable after use. It is of course envisaged that the applicator device 28 namely the cartridge reservoir, will be integrally formed as plastics or other similar material.

It will be appreciated the downward pressure which causes sealing of the applicator devices according to the present invention is via the paste which being incompressible paste transmits such downwardly mainly against the walls defining the pressure reduction means etc., to create the peripheral seal via foil 19 at the outlet.

An adaptor device 41(or "incremental cap") is illustrated in FIGS. 12–15 the drawings and is schematically illustrated in FIG. 13 on an elongate replaceable paste reservoir 2 mounted on a paste applicator device 43 and comprises an elongate pressing member 44 which is to rest on and downwardly displace the elongate piston (7 in FIG. 1) of the reservoir 2 to displace paste therefrom out of the bottom and through the applicator device 43 whose bottom outlet is peripherally sealed against a stencil therebelow (not shown) as the device 43 slides over the stencil.

The piston pressing member 44 is connected via two, one-way movement enabling devices or ball locks 46 to an elongate pressure receiving member 47 such that the member 44 is displaceable substantially parallely with member 47 and member 47 is biased to be able to move in said one-way away from the piston pressing member 44.

As shown in FIG. 15 each ball lock 46 comprises a tubular member 48 connected by a threaded screw with knurled head 45 to piston pressing member 44. The tubular member 48 slidingly extends through an aperture in pressure receiving member 47 and has an outwardly extending upper flange 48A to prevent downward removal. The tubular member 48 is closed or restricted at its lower end and contains a compression spring 49 which extends out of member 48 into contact with a plastics screw cap 50 which in turn has external threads 50A engaging with an internally threaded passage portion 51A of an aluminium annular cap 51 which is connected at its lower region to an annular hardened steel taper lock 52 with part conical surfaces 52A converging upwardly and against which ball bearings 53 of the lock may jam. The balls 53 are supported on an annular ring 54 which slides on the outside of the tubular member 48 and is biased upwardly by spring 55 into locking engagement with surfaces 52A and upwardly with the outer surface of tubular member 48. The lower end of spring 55 rests on pressure receiving member 47. The lower end of screw cap 50 is engageable with the circle of balls 13 by being screwed down (or pushed down and twisted to hold down when a bayonet type filling is removed) and can disengage such balls from the surface 52A etc., so as to release the one way device 46 and enable movement in two directions. Otherwise the one way device 46 normally only enables movement of tubular member 48 and cap 46 and pressure receiving member 47 upwardly away from member 44 to a limited extent determined by stops 58 on the end of guide posts 58A which move through apertures 58B in member 47. Downward movement of the whole adaptor device 46 to displace the reservoir piston 7 is under the alternate action of pressing members 56 when attached to a solder paste screen printing machine (not shown). In downward movement, there is no relative movement between members 44 and 47 as the device 6 will be locked.

The device of FIG. 12 is for a common printing machine with alternately mechanically reciprocating squeegee blade holders and two connector bars 56, 56A, one shown with scalloped ends to abut either side of the lower parts of one-way devices 16.

In FIGS. 13 the hook shaped device 57 is simply an attachment device for a printing machine having only a single vertically reciprocating device and is of little importance to the inventive concept.

There will now be described preferred practical/operational features of the adaptor device:

The device 41 is fitted to paste printing machines (not shown) (via 56, 56A or 57) that features a squeegee down force feedback system. The concept is to provide a constant working height (e.g. 41.5 mm) so avoiding excessive vertical squeegee pressing member travel during the print stroke. The device 41 is purely mechanical with no outside power source of any kind required except the downward and horizontal mechanical pressures of the printing machine. The drive to dispense the paste is supplied by the squeegee pressing member down force applied to the member 47. The member 47 features two one-way movement enabling mechanisms 6. Each successive downward movement of the machine squeegee mechanism extends follower plate or member 44 onto the piston thus driving the paste. The pressure receiving member 47 is biased back to its original level (determined by stops 58) after each print stroke by springs 49, leaving the follower plate 44 in contact with the piston 7. The whole process is then repeated until the paste cartridge 6 is emptied.

Paste replenishment requires that the paste applicator device 43 be removed from the machine. In the case of a permanent fixture to a machine, a quick release mechanism is incorporated to allow applicator 43 to be removed from the machine interface. In order to replace or recharge the paste cartridge or reservoir 6, the one-way mechanisms 46 must be disabled. Turning the caps 50 on the tops of the mechanisms 46, one turn in a clockwise direction releases each and allows the follower or piston pressing member 44 to be returned to be adjacent member 47. A new cartridge 6 can be loaded into the applicator device 43 or the existing cartridge 6 recharged. Once reassembled, the one-way mechanisms 46 have to be re-enabled. This is done by simply turning the caps 50 one turn in a counter clockwise direction to enable ring 54 to act on balls 53 to activate the one-way movement enabling devices 46 to enable further printing.

The upward movement of the pressure receiving member 47 is limited by two stops 58 which each comprise a large headed screw member having a shank 58A as guide post extending through an aperture 58A on member 47 and screwed onto pressing member 44 and being such as to limit the maximum spacing between members 44 and 47 although normally the back-pressure of the paste ensures that the maximum downward displacement permissible for the pressing members of the reciprocating squeegee mechanism of the printing machine as mentioned previously is not exceeded. This is sometimes merely the amount by which a hitherto used squeegee would flex under pressure. Thus adaptor device of the invention will operate so as to prevent the printing machine unnecessarily cutting off.

The member 44 preferably moves parallel to member 47.

In FIG. 16 the applicator device 46 is in its starting position and when pressure is exerted downwardly on member 47, the whole device moves down until stopped by back pressure in the paste. In FIG. 7, on release of the down pressure member 47 and 50–57 the one biased upwardly away from member 44 and the process then continues until an end position such as in FIG. 18 is reached.

In an improvement to the adaptor device so that an operator, in use, can be appraised of how much fluid material, normally solder paste, remains in the reservoir of the applicator device, at least one and preferably two upstanding projections or pillars are mounted on the piston pressing member of the adaptor device and each extends upwardly and preferably passes through apertures in the pressure receiving member and thus its relative extension above the aperture is representative of the paste remaining. Preferably a transducer and transmitting device or other position sensing and display or relaying means is provided to determine the amount of projection of the projection or pillar through the aperture and above the pressure receiving member and to transmit such, preferably via radio or other wire less connection, to a receiver which displays the amount of paste remaining.

The invention claimed is:

1. An applicator device for abutment by or attachment to a reciprocating mechanism of a viscous fluid material printing machine, the applicator device being for applying a viscous fluid material to a surface therebeneath and comprising:
   a body having a through passage with an upper, fluid inlet extending along the body, a lower, fluid outlet extending along the body and pressure reduction means between the inlet and the outlet of the body for reducing the pressure of the fluid material;
   a sealing gasket or foil for peripherally sealing the outlet of the body against a stencil on being pressed thereagainst;
   an elongate, horizontally-extending reservoir for fluid material formed with or detachably mounted on an upper side of the body and being in fluid communication with the inlet of the body; and
   a displaceable piston extending in the reservoir for displacing fluid material out of the reservoir into the inlet of the body and, via the pressure reduction means, to the outlet of the body, with the piston being actuable from above by the reciprocating mechanism of the printing machine so as to be displaceable thereby and the applicator device being without and not requiring any other separate motive power source or pipe ducting means for such displacement.

2. A device as claimed in claim 1, further comprising:
   first and second pusher members, each being connectable to or abuttable by the reciprocating mechanism of the printing machine so as to be alternately upwardly/downwardly operatively displaceable at the end of each horizontal displacement and act on the piston.

3. A device as claimed in claim 2, wherein the pusher members each act via a pressure distribution portion thereof, which spreads the pressure across the piston transverse to the longitudinal extent thereof, such as to minimize any backwards/forwards tilting movement of the piston.

4. A device as claimed in claim 3, wherein the pressure distribution portions have a complementary shape so as to interdigitate.

5. A device as claimed in claim 4, wherein the pressure distribution portions have a castellated outline.

6. A device as claimed in claim 2, wherein the pusher members are adapted to provide for an alternate tilting displacement of the piston along the length thereof such as at least to maintain the characteristics of the fluid material.

7. A device as claimed in claim 1, wherein the body comprises an elongate plate member including an elongate slot as the pressure reduction means between the inlet and the outlet of the body.

8. A device as claimed in claim 7, wherein the reservoir is securably mountable on an upper side of the plate member, and includes at least one outlet in fluid communication with the slot.

9. A device as claimed in claim 7, wherein the reservoir is provided by a continuous upstanding wall on the plate member extending around the slot to contain fluid material.

10. A device as claimed in claim 1, further comprising:
    at least one sliding or slidable spacing member having a planar lower face disposed to the bottom of the body and extending along opposite sides of the sealing gasket or foil, which gasket or foil includes a sealing edge which, when not being biased by the counter-pressure of a stencil, extends beneath the lower face of the at least one spacing member such that the at least one spacing member in part determines the amount the sealing edge is displaced upwardly against resilient means when the sealing edge and the at least one spacing member are supported on a stencil.

11. A device as claimed in claim 1, wherein the sealing gasket or foil is formed from a sheet of flexible material and has an uninterrupted or continuous, non-apertured outer part extending around the periphery of the outlet of the body and surrounding an apertured inner region.

12. A device as claimed in claim 11, wherein a continuous resilient ring is located between the body and the sealing gasket or foil extending around the outlet of the body so as in use to form a seal between the body and the sealing gasket or foil.

13. A device as claimed in claim 1, wherein the body, the reservoir and the sealing gasket or foil are integrally formed.

14. A device as claimed in claim 13, wherein the body includes at least one opening as the pressure reduction means which has a peripheral side formed of flexible material and extending downwardly such as to define a sealing surface which extends as an uninterrupted or continuous, non-apertured outer portion around the periphery of the at least one opening.

15. A solder paste stencil printing machine including a reciprocating mechanism in combination with an applicator device as claimed in claim 1, wherein the reciprocating mechanism is operative to exert a pressure and driving force which acts both horizontally to reciprocate the applicator device over the surface of the stencil and apply a downward pressure on the piston and the solder paste thereunder so as to provide the pressure to maintain the sealing gasket or foil in sealing contact with the stencil therebeneath and cause the solder paste to be discharged from the reservoir and through apertures in the stencil onto a circuit board or other electronic component or substrate therebeneath.

16. A combination as claimed in claim 15, wherein the reciprocating mechanism includes first reciprocating means for effecting reciprocating displacement of the applicator device in a horizontal or substantially horizontal direction and second reciprocating means for effecting vertical or other upward/downward displacement of the piston of the applicator device, preferably by at least one pusher member of the applicator device.

17. An applicator device as claimed in claim 1 in combination with an adaptor device for enabling the applicator device to be acted upon by at least one vertically or substantially vertically displaceable pressing member of a viscous fluid material screen printing machine, the adaptor device comprising:
    a piston-pressing member locatable on the piston of the applicator device; a pressure-receiving member which is to be acted upon directly or indirectly by the at least one pressing member of the printing machine; and at least one one-way movement enabling device connecting the piston-pressing member and the pressure-receiving member such as normally only to permit upward movement of the pressure-receiving member relative to the piston-pressing member, wherein, with downward displacement of the pressure-receiving member, the piston-pressing member is displaced downwardly together with the pressure-receiving member such as to urge fluid material contained within the reservoir of the applicator device downwardly and out of the reservoir of the applicator device, and the pressure-receiving member being biased away from the piston-pressing member so as to be displaced upwardly to a raised position following each downward displacement thereof.

18. A combination as claimed in claim 17, wherein a surface of the pressure-receiving member which is engaged by the at least one pressing member of the printing machine is of or displaced to a height such that, in operation, the required downward displacement of the at least one pressing member of the printing machine does not exceed a maximum displacement of the at least one pressing member of the printing machine as permitted in normal operation of the printing machine without interruption.

19. A combination as claimed in claim 17, wherein the pressure-receiving member includes at least one aperture, and the piston-pressing member includes at least one projection which extends through the at least one aperture in the pressure-receiving member, with the at least one projection acting to space the piston-pressing member from the pressure-receiving member and including an enlargement which limits the extent to which the piston-pressing member and the pressure-receiving member can be biased apart.

20. A combination as claimed in claim 19, wherein the piston-pressing and pressure-receiving members are separable when changing the applicator device.

21. A combination as claimed in claim 17, wherein the at least one one-way movement enabling device is a ball-lock device which includes an annular tapered section and locking balls which lock with the tapered section when the pressure-receiving member is biased downwardly relative to the piston-pressing member and enable movement when the pressure-receiving member is raised relative to the piston-pressing member.

22. A combination as claimed in claim 21, wherein the ball-lock device includes a ball displacement cap and is releasable by screwing down the ball displacement cap to displace the locking balls downwardly such as to disengage the locking balls from the tapered section and, where the locking balls are so disengaged, the pressure-receiving member can be raised or lowered relative to the piston-pressing member.

23. A combination as claimed in claim 17, wherein the piston-pressing member is an elongate member which is coextensive with the piston of the applicator device and the connection between the piston-pressing member and the piston guides the piston-pressing member such that any tendency for the piston to tilt is at least reduced.

24. An applicator device as claimed in claim 1 in combination with an adaptor device for enabling the applicator device to be acted upon by at least one vertically or substantially vertically displaceable pressing member of a viscous fluid material screen printing machine, the adaptor device comprising:

a pressure-receiving member which is to be acted upon directly or indirectly by the at least one pressing member of the printing machine; and a piston-pressing member which is locatable on the piston of the applicator device and coupled to the pressure-receiving member such as to be moved downwardly together with the pressure-receiving member to cause the piston to be displaced downwardly and urge fluid material contained within the reservoir downwardly therefrom;

wherein a surface of the pressure-receiving member which is engaged by the at least one pressing member of the printing machine is of or displaced to a height such that, in operation, the required downward displacement of the at least one pressing member of the printing machine does not exceed a maximum displacement of the at least one pressing member of the printing machine as permitted in normal operation of the printing machine without interruption.

* * * * *